United States Patent
Tanada (10) Patent No.: US 6,674,814 B2
(45) Date of Patent: Jan. 6, 2004

(54) FREQUENCY ERROR ESTIMATING APPARATUS AND A FREQUENCY ERROR ESTIMATING METHOD

(75) Inventor: Kazuo Tanada, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 2 days.

(21) Appl. No.: 09/798,900

(22) Filed: Mar. 6, 2001

(65) Prior Publication Data

US 2001/0008543 A1 Jul. 19, 2001

Related U.S. Application Data (63) Continuation of application No. PCT/JP00/04409, filed on Jul. 3, 2000.

(30) Foreign Application Priority Data

Jul. 7, 1999 (JP) .............................. 11-193146

(51) Int. Cl.$^7$ .............................................. H04L 27/14
(52) U.S. Cl. ........................................................ 375/326
(58) Field of Search ............................. 325/226, 227, 325/326, 294, 285, 284, 327, 340, 346, 371, 373, 375, 376; 329/307, 302, 313, 323, 325, 318, 319, 320; 327/8, 45, 47, 54, 156

(56) References Cited

U.S. PATENT DOCUMENTS

| | | | |
|---|---|---|---|
| 5,090,027 A | | 2/1992 | Ohsawa |
| 5,481,270 A | * | 1/1996 | Urkowitz et al. ............. 342/101 |
| 5,499,268 A | * | 3/1996 | Takahashi .................... 375/231 |
| 5,684,836 A | | 11/1997 | Nagayasu et al. |
| 6,058,101 A | * | 5/2000 | Huang et al. ................. 370/208 |
| 6,181,755 B1 | * | 1/2001 | Junell ........................... 375/362 |
| 6,192,090 B1 | * | 2/2001 | Lee .............................. 375/346 |
| 6,205,188 B1 | * | 3/2001 | Stott et al. .................... 375/344 |
| 6,230,021 B1 | * | 5/2001 | Ohdachi ....................... 455/502 |
| 6,304,582 B1 | * | 10/2001 | Zhang et al. ................. 370/503 |
| 6,307,898 B1 | * | 10/2001 | Ido .............................. 375/326 |
| 6,337,855 B1 | * | 1/2002 | Malkamaki .................. 370/347 |
| 6,347,126 B1 | * | 2/2002 | Nagayasu et al. ........... 375/344 |
| 6,456,609 B2 | * | 9/2002 | Ohgoshi et al. ............. 370/335 |

FOREIGN PATENT DOCUMENTS

| | | |
|---|---|---|
| EP | 1732833 | 9/1996 |
| JP | 2280552 | 11/1990 |
| JP | 316318 | 1/1991 |
| JP | 047942 | 1/1992 |
| JP | 6177801 | 6/1994 |
| JP | 6188787 | 7/1994 |
| JP | 6232926 | 8/1994 |
| JP | 766842 | 3/1995 |
| JP | 8251244 | 9/1996 |
| JP | 10210095 | 8/1998 |

OTHER PUBLICATIONS

Kubo et al., IEICE Trans. Commun., vol. E82–B, No. 1, pp. 136–144 (1999).

Simon et al., IEEE Trans, Commun., vol. 37, No. 2, pp. 99–109 (1989).

* cited by examiner

*Primary Examiner*—Emmanuel Bayard
(74) *Attorney, Agent, or Firm*—Birch, Stewart, Kolasch & Birch, LLP

(57) ABSTRACT

A frequency error estimating apparatus for estimating a frequency error between a local oscillation frequency and a carrier frequency of a received signal in a receiver includes a frequency error estimating unit (11) that suppresses a noise component included in the received signal according to a filter coefficient input to an averaging filter (23), and estimates a frequency error based on an output of the filter; and a filter coefficient determining unit (12) that calculates a filter coefficient based on a differential of estimate values of the frequency error from a first symbol, and changes the characteristics of the filter. In the receiver, the frequency error estimating apparatus can secure high precision in estimating a frequency error without losing the level of following the time variation in the Doppler frequency.

18 Claims, 6 Drawing Sheets

| $|\Delta \omega d|$ | $\alpha$ |
|---|---|
| 0 ~ W1 | 1/2048 |
| W1 ~ W2 | 1/1024 |
| W2 ~ W3 | 1/512 |
| W3 ~ | 1/256 |

FREQUENCY ERROR ESTIMATING APPARATUS AND A FREQUENCY ERROR ESTIMATING METHOD

This application is a Continuation of PCT International Application No. PCT/JP00/04409 filed on Jul. 3, 2000, which designated the United States, and on which priority is claimed under 35 U.S.C. §120, the entire contents of which are hereby incorporated by reference.

TECHNICAL FIELD

The present invention relates to a frequency error estimating apparatus for estimating a frequency error or a frequency differential between a local oscillation frequency and a carrier frequency of a received signal in a receiver used for a satellite communication, a mobile satellite communication and a mobile communication. The invention particularly relates to a frequency error estimating apparatus capable of securing high precision in estimating a frequency error without losing the level of following the time variation in the Doppler frequency.

BACKGROUND ART

A conventional frequency error estimating apparatus will be explained below. Some of the receivers used for mobile communications employ a synchronous detection system that is capable of obtaining satisfactory detection characteristics even in a low C/N channel. According to this synchronous detection system, a carrier that is synchronous with a carrier frequency of a received signal is reproduced, and a detection output is obtained based on this carrier. However, the receiver that employs the synchronous detection system has variations in the oscillation frequency due to variations in the precision of the oscillator, variations in temperature, etc. As a result, there arises a difference in the frequency between the transmitter and the receiver. In other words, a frequency error occurs between the transmitter and the receiver. When such a frequency error exists, the phase at a signal point on an IQ plane (a complex plane expressed by a real axis and an imaginary axis) rotates.

Therefore, in order to minimize this frequency error and to improve the synchronous characteristics in the receiver, it becomes necessary to provide a frequency error estimating apparatus that measures a phase rotation volume from a received signal and estimates a frequency error from a result of this measurement.

Figure 8:
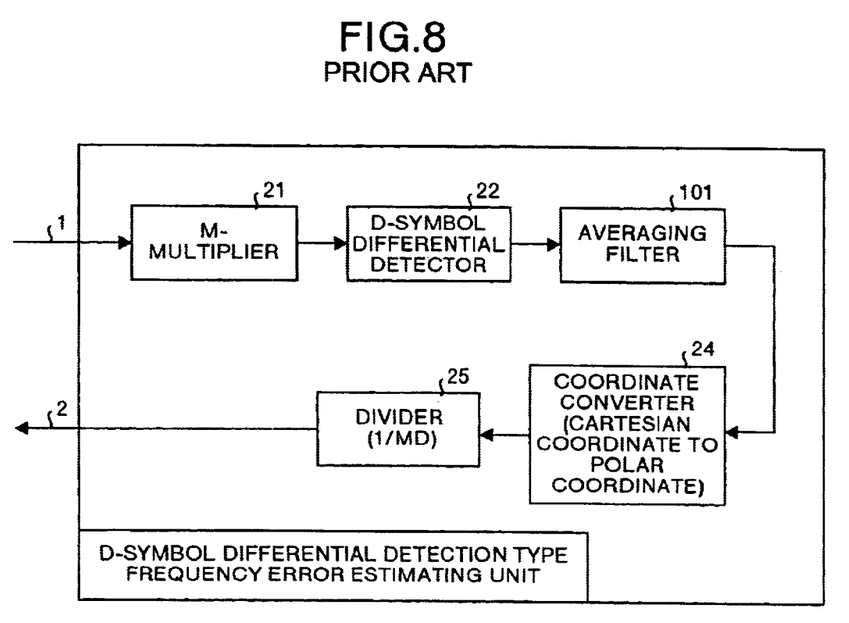
FIG. 8 is a diagram showing a structure of a conventional frequency error estimating apparatus.

FIG. 8 shows a structure of a conventional frequency error estimating apparatus. This frequency error estimating apparatus is disclosed in "Doppler-Corrected Differential Detection of MPSK", IEEE Trans. Commun., Vol. COM-37, 2, pp. 99–109, Feb., 1989. In FIG. 8, legend 1 denotes a received signal, legend 21 denotes an M-multiplier for removing a modulation component of the received signal 1, and legend 22 denotes a D-symbol differential detector for performing differential detection over a period of D symbols based on the output of the M-multiplier 21. Legend 101 denotes an averaging filter for averaging the output of the D-symbol differential detector 22, and thereby suppressing a noise component. Legend 24 denotes a coordinate converter for calculating a phase component from the output of the averaging filter 101, and legend 25 denotes a divider for calculating a frequency error from a phase component that has been output from the coordinate converter 24. Legend 2 denotes an estimated frequency error value that is output from the divider 25.

Figure 9:
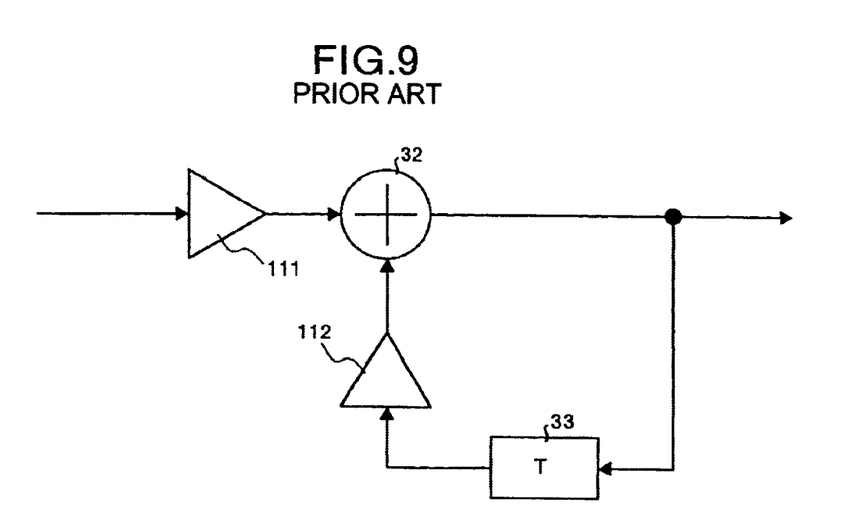
FIG. 9 is a diagram showing an example of an internal structure of a conventional averaging filter.

FIG. 9 shows an example of an internal structure of the averaging filter 101. This shows an IIR (a primary infinite impulse response) filter. In FIG. 9, legends 111 and 112 denote multipliers for multiplying an input signal by a specific coefficient respectively. Legend 32 denotes an adder for adding two inputs, and 33 denotes a delay unit for delaying a signal by one symbol.

The conventional frequency error estimating apparatus having the above-described structure is a D-symbol differential detection type frequency error estimating apparatus that estimates a phase change volume due to a frequency error, by performing differential detection over a period of D symbols based on a received signal.

The operation principle of the conventional frequency error estimating apparatus will be explained with reference to FIG. 8 and FIG. 9. When a modulation system used is the M-phase PSK (phase shift keying) system, the received signal 1 (r(nT)) is expressed by the following equation (1).

$$r(nT)=A(nT)\exp[j\{\theta(nT)+\Delta\omega nT\}] \quad (1)$$

In the equation (1), the received signal 1 (r(nT)) is a complex base band signal sampled in a symbol period T. A(nT) expresses an amplitude component, and $\Delta\omega$ expresses an angular frequency error. $\theta(nT)$ expresses a modulation component, and this takes M values of, for example, $2\pi k/M$ (k=0, 1, ..., and M−1). To simplify the explanation, it is assumed that there is no noise component.

The M-multiplier 21 multiplies the received signal 1 by a modulation multiple number M for removing the modulation component of the received signal 1. A signal after the multiplication (r1(nT)) is expressed by the following equation (2).

$$r1(nT)=A(nT)\exp[jM\{\theta(nT)+\Delta\omega nT\}] \quad (2)$$

In the equation (2), $M\theta(nT)$ is a multiple of $2\pi$, and therefore, this can be disregarded. The equation (2) can be substituted by the following equation (3).

$$r1(nT)=A(nT)\exp(jM\Delta\omega nT) \quad (3)$$

The D-symbol differential detector 22 performs differential detection over a period of D symbols based on the output (r1(n)) from the M-multiplier 21. A signal after the differential detection (d1(nT)) is expressed by the following equation (4).

$$d1(nT)=r1(nt)r1^*(nT-DT)=A(nT)A(nT-DT)\exp(jMD\Delta\omega T) \quad (4)$$

In the equation (4), r1* (nT−DT) is a conjugate complex number of r1(nT−DT).

The averaging filter 101 averages the output (d1(nT) of the D-symbol differential detector 22, and thereby suppresses the noise component. For example, when the primary IIR filter shown in FIG. 9 is used as the averaging filter, an output (d2(nT)) of the averaging filter 101 is expressed by the following equation (5).

$$d2(nT)=\alpha d1(nT)+(1-\alpha)d2(nT-T) \quad (5)$$

In the equation (5), the first term is a result of the multiplier 111 multiplying the input signal (d1(nT)) by the coefficient $\alpha$, and the second term is a result of the multiplier 112 multiplying the one symbol-delayed output (d2(nT−T)) of the averaging filter 101 by the coefficient 1−$\alpha$.

When it is assumed that the sampling timing is a Nyquist point, that is, when the amplitude component is assumed as 1, the output (d2(nT)) of the averaging filter 101 is expressed by the following equation (6).

$$d2(nT)=\exp(jMD\Delta\omega T) \quad (6)$$

The coordinate converter 24 converts the output (d2(nT)) of the averaging filter 101 from a Cartesian coordinate into a polar coordinate, and calculates the phase component (MDΔωT). Last, the divider 25 divides the phase component (MDΔωT) that is the output of the coordinate converter 24 by MD, thereby to calculate the angular frequency error (ΔωT) over one symbol, and outputs a calculated result.

According to the above-described conventional frequency error estimating apparatus, however, in order to estimate a frequency error in high precision, it is necessary to set the coefficient α of the multiplier in the averaging filter to a value as small as possible for increasing the averaging effect. On the other hand, when the received signal receives a large Doppler shift and the Doppler frequency further varies with time like in the mobile communication satellite, it is necessary that the frequency error estimating apparatus follows this variation and estimates the frequency error. In other words, in order to increase this level of following the time variation in the Doppler frequency, it is necessary to set the coefficient α of the multiplier in the averaging filter to a value as large as possible.

As the coefficient α of the multiplier has been fixed in the conventional frequency error estimating apparatus, there has been a problem that it is difficult to satisfy both increasing the precision in estimating the frequency error and increasing the level of following the time variation in the Doppler frequency of the variation in the Doppler frequency.

It is an object of the present invention to provide a frequency error estimating apparatus and a frequency error estimating method capable of securing high precision in estimating the frequency error in a receiver, without losing the level of following the time variation in the Doppler frequency.

DISCLOSURE OF THE INVENTION

In order to achieve the above object, according to a first aspect of the present invention, there is provided a frequency error estimating apparatus for estimating a frequency error between a local oscillation frequency and a carrier frequency of a received signal in a receiver, the frequency error estimating apparatus comprising: frequency error estimating unit (corresponding to a frequency error estimating unit 11 in an embodiment to be described later) that suppresses a noise component included in the received signal according to a filter coefficient input to a filter, and estimates a frequency error based on an output of the filter; and filter coefficient determining unit (corresponding to a filter coefficient determining unit 12) that calculates a filter coefficient based on a differential of estimate values of the frequency error from a first symbol, and changes the characteristics of the filter.

According to the above aspect, it is possible to satisfy both the level of following the time variation in the Doppler frequency and the precision in estimating the frequency error, by changing the characteristics of a filter for suppressing a noise component of a received signal according to the size of the time variation in the Doppler frequency.

Further, according to a second aspect of the invention, there is provided a frequency error estimating apparatus of the above aspect, wherein the frequency error estimating unit comprises: a modulation component removing unit (corresponding to an M-multiplier 21) that removes a modulation component from the received signal; a phase change information generating unit (corresponding to a D-symbol differential detector 22) that generates phase change information by performing differential detection over a period of a second symbol based on a signal after removing a variation component, an averaging filter unit (corresponding to an averaging filter 23) that suppresses a noise component in the phase change information based on the filter coefficient; and a frequency error estimating unit (corresponding to a coordinate converter 24 and a divider 25) that calculates a frequency error estimate value based on a signal after suppressing the noise component.

According to the above aspect, when the time variation in the Doppler frequency is slow, the filter coefficient is set to a value as small as possible, and when the time variation in the Doppler frequency is fast, the filter coefficient is set to a value as large as possible. The frequency error estimating unit estimates a frequency error based on this filter coefficient. With this arrangement, when the time variation in the Doppler frequency is slow, the filter averaging effect is increased, and it is possible to estimate the frequency error in high precision. On the other hand, when the time variation in the Doppler frequency is fast, it is possible to estimate the frequency error in high precision by following this variation.

Further, according to a third aspect of the invention, there is provided a frequency error estimating apparatus of the above aspect, wherein the frequency error estimating unit comprises: a plurality of differential detection type frequency error estimating units (corresponding to D-symbol differential detection type frequency error estimating units 51a, 51b, . . . , and 51c) that generate phase change information by performing differential detection over periods of predetermined symbols based on a received signal after removing a modulation component, then suppress a noise component in the phase change information based on the filter coefficient, and thereafter estimate a frequency error based on a signal after suppressing the noise component; and a selecting unit (corresponding to a selector 52) that selects an optimum frequency error, based on a predetermined standard, from a plurality of frequency errors that have been estimated by the plurality of differential detection type frequency error estimating unit after performing differential detection over different periods of symbols based on received signals.

According to the above aspect, the frequency error estimating apparatus operates while eliminating the uncertainty in the frequency by selecting an optimum frequency error. Therefore, the differential detection type frequency error estimating unit with a shortest distance of a differential detection symbol determines an estimating range of a frequency error. Then, the differential detection type frequency error estimating unit with a longest distance of a differential detection symbol determines the estimate precision. With this arrangement, it is possible to achieve both the wide estimating range and high estimate precision at the same time.

Further, according to a fourth aspect of the invention, there is provided a frequency error estimating apparatus of the above aspect, wherein the filter coefficient determining unit includes in advance a correspondence table that relates differential values between estimate values of the frequency error to the filter coefficients, whereby, after calculating a differential value, the filter coefficient determining unit, selects a filter coefficient corresponding to the differential value from the correspondence table, and changes the characteristics of the filter according to the value of the selected filter coefficient.

According to the above aspect, there is prepared in advance a correspondence table that relates differential values between estimate values of the frequency error to the filter coefficients. The values of the multiplier coefficients in the correspondence table are determined in advance to take optimum values by a simulation using a calculator or something like that. With this arrangement, it is possible to select easily a filter coefficient corresponding to a differential value by referring to the correspondence table. As a result, it is possible to select an optimum filter coefficient according to a time variation in the Doppler frequency.

Further, according to a fifth aspect of the invention, there is provided a frequency error estimating apparatus of the above aspect, wherein the filter coefficient determining unit further includes a counter of a specific period, whereby the filter coefficient determining unit updates the filter coefficient in a period determined by the counter.

According to the above aspect, while it is possible to update the filter coefficient for each symbol, the updating is carried out in a specific period by using a counter in this case. With this arrangement, it is possible to improve easily the stability of the filter coefficient determining unit.

Further, according to a sixth aspect of the invention, there is provided a frequency error estimating method for estimating a frequency error between a local oscillation frequency and a carrier frequency of a received signal in a receiver, the frequency error estimating method comprising: a first step of suppressing a noise component included in the received signal according to a filter coefficient input to a filter, and estimating a frequency error based on an output of the filter; and a second step of calculating a filter coefficient based on a differential of estimate values of the frequency error from a first symbol, and changing the characteristics of the filter.

According to the above aspect, it is possible to satisfy both the level of following the time variation in the Doppler frequency and the precision in estimating the frequency error, by changing the characteristics of a filter for suppressing a noise component of a received signal according to the size of the time variation in the Doppler frequency.

Further, according to a seventh aspect of the invention, there is provided a frequency error estimating method of the above aspect, wherein the first step comprises: a third step of removing a modulation component from the received signal; a fourth step of generating phase change information by performing differential detection over a period of a second symbol based on a signal after removing a variation component, a fifth step of suppressing a noise component in the phase change information based on the filter coefficient; and a sixth step of calculating a frequency error estimate value based on a signal after suppressing the noise component.

According to the above aspect, when the time variation in the Doppler frequency is slow, the filter coefficient is set to a value as small as possible, and when the time variation in the Doppler frequency is fast, the filter coefficient is set to a value as large as possible. At the first step, a frequency error is estimated based on this filter coefficient. With this arrangement, when the time variation in the Doppler frequency is slow, the filter averaging effect is increased, and it is possible to estimate the frequency error in high precision. On the other hand, when the time variation in the Doppler frequency is fast, it is possible to estimate the frequency error in high precision by following this variation.

Further, according to an eighth aspect of the invention, there is provided a frequency error estimating method of the above aspect, wherein the first step comprises: a plurality of seventh steps of generating phase change information by performing differential detection over periods of predetermined symbols based on a received signal after removing a modulation component, then suppressing a noise component in the phase change information based on the filter coefficient, and thereafter estimating a frequency error based on a signal after suppressing the noise component; and an eighth step of selecting an optimum frequency error, based on a predetermined standard, from a plurality of frequency errors that have been estimated by the plurality of seventh steps after performing differential detection over different periods of symbols based on received signals.

According to the above aspect, the operation is carried out while eliminating the uncertainty in the frequency by selecting an optimum frequency error. Therefore, an estimating range of a frequency error is determined at the seventh step when a distance of a differential detection symbol is shortest. Then, the estimate precision is determined at the seventh step when a distance of a differential detection symbol is longest. With this arrangement, it is possible to achieve both the wide estimating range and high estimate precision at the same time.

Further, according to a ninth aspect of the invention, there is provided a frequency error estimating method of the above aspect, wherein the second step comprises a ninth step of preparing in advance a correspondence table that relates differential values between estimate values of the frequency error to the filter coefficients, whereby, after calculating a differential value, a filter coefficient corresponding to the differential value is selected from the correspondence table, and the characteristics of the filter are changed according to the value of the selected filter coefficient.

According to the above aspect, there is prepared in advance a correspondence table that relates differential values between estimate values of the frequency error to the filter coefficients. The values of the multiplier coefficients in the correspondence table are determined in advance to take optimum values by a simulation using a calculator or something like that. With this arrangement, it is possible to select easily a filter coefficient corresponding to a differential value by referring to the correspondence table. As a result, it is possible to select an optimum filter coefficient according to a time variation in the Doppler frequency.

Further, according to a tenth aspect of the invention, there is provided a frequency error estimating method of the above aspect, wherein the second step further comprises a tenth step for counting in a specific period, whereby the filter coefficient is updated in a period determined by the counter.

According to the above aspect, while it is possible to update the filter coefficient for each symbol, the updating is carried out in a specific period by using a counter in this case. With this arrangement, it is possible to improve easily the stability of the filter coefficient obtained at the second step.

BEST MODE FOR CARRYING OUT THE INVENTION

Preferred embodiments of the present invention will be explained in detail below with reference to the attached drawings.

Figure 1:
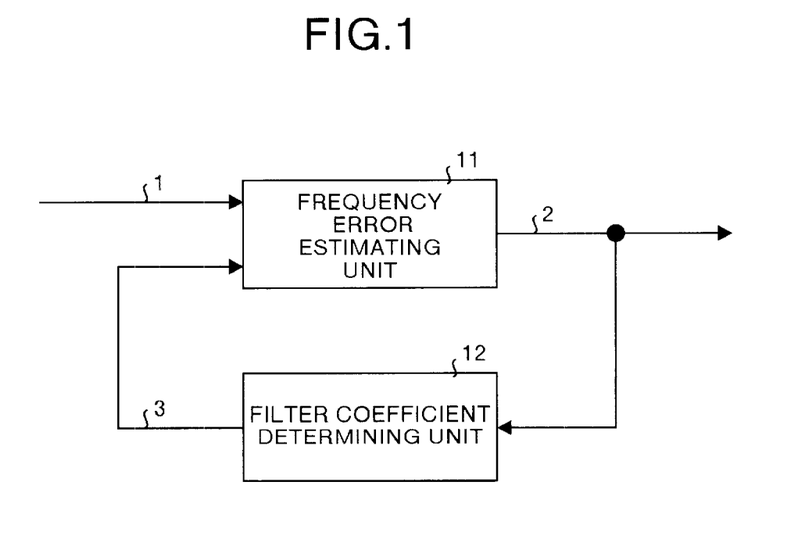
FIG. 1 is a block diagram showing an example of a structure of a frequency error estimating apparatus relating to a first embodiment of the present invention.

FIG. 1 is a block diagram showing an example of a structure of a frequency error estimating apparatus relating to a first embodiment of the present invention. In FIG. 1, legend 1 denotes a received signal, and legend 11 denotes a frequency error estimating unit for estimating a frequency error or differential between a local oscillation frequency and a carrier frequency of the received signal. Legend 2 denotes an estimated frequency error value, legend 12 denotes a filter coefficient determining unit for calculating filter coefficient information of the averaging filter included in the frequency error estimating unit 11 based on the estimated frequency error value 2, and legend 3 denotes the filter coefficient information.

Figure 2:
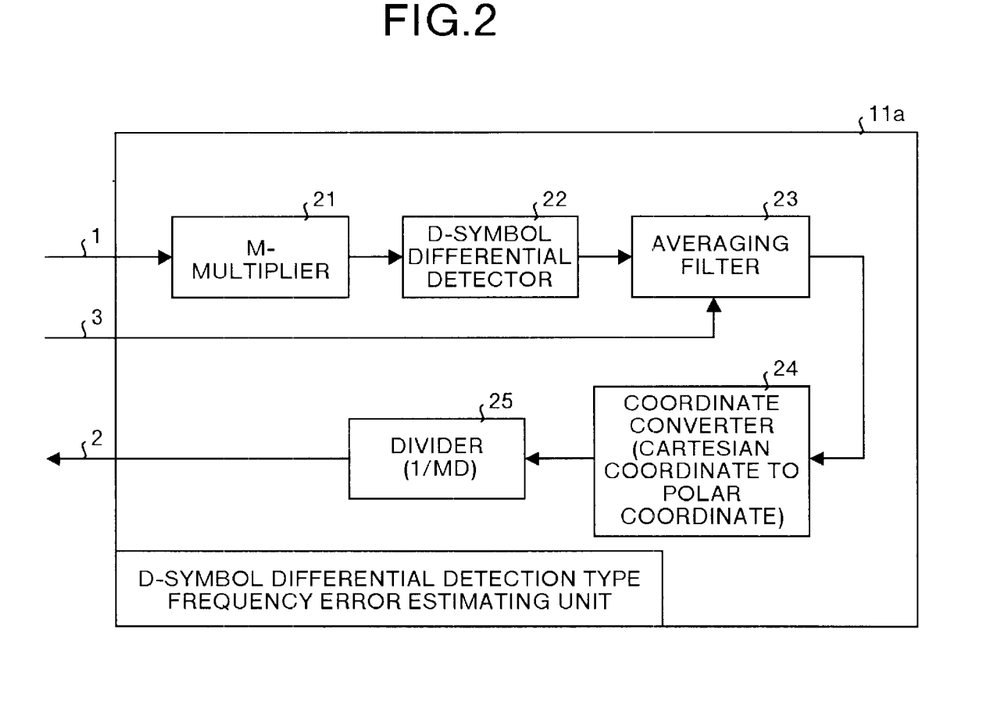
FIG. 2 is a diagram showing an example of an internal structure of a frequency error estimating unit 11.

FIG. 2 is a diagram showing an example of an internal structure of the frequency error estimating unit 11. This figure shows an example of a D-symbol differential detection type frequency error estimating unit 11a. In the present embodiment, items that are similar to those explained in the above prior-art technique are provided with same legends, and their explanation will be omitted. The D-symbol differential detection type frequency error estimating unit 11a shown in FIG. 2 is based on a principle similar to that of the D-symbol differential detection type frequency error estimating unit explained in the above prior-art technique. The D-symbol differential detection type frequency error estimating unit 11a is different from the conventional D-symbol differential detection type frequency error estimating unit in that the filter coefficient information 3 is input to the averaging filter 23, and that the filter characteristics of the averaging filter 23 change based on the filter coefficient information 3.

Figure 3:
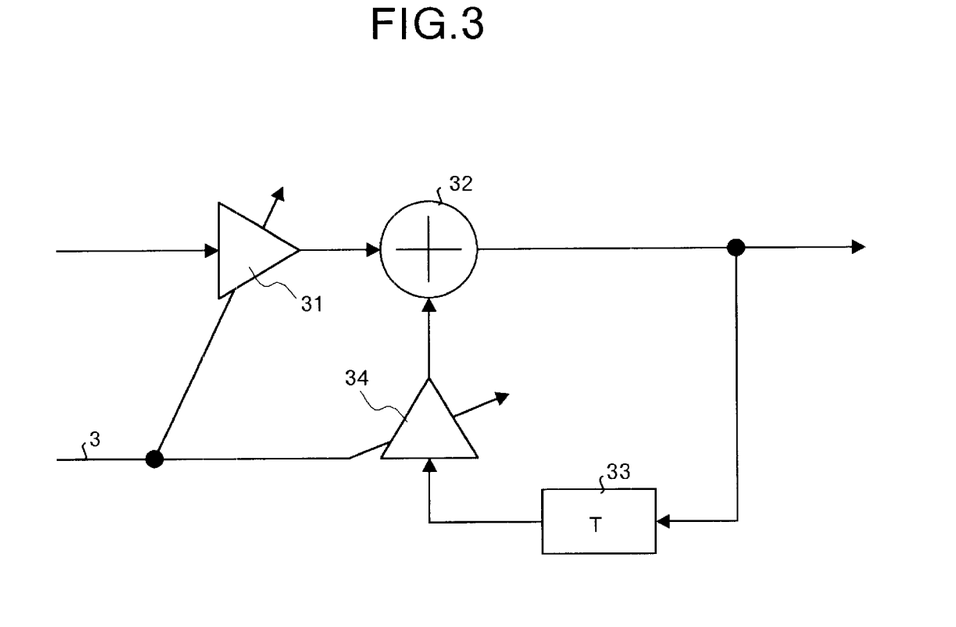
FIG. 3 is a diagram showing an example of an internal structure of an averaging filter 23.

FIG. 3 is a diagram showing an example of an internal structure of the averaging filter 23. This averaging filter 23 is a primary IIR filter similar to the averaging filter 101 explained in the above prior-art technique. The averaging filter 23 is different from the averaging filter 101 in that the filter coefficient information 3 is input to this averaging filter 23, and that multipliers 31 and 34 are provided in place of the multipliers 111 and 112, and the multiplier coefficients of the multipliers 31 and 34 change according to the filter coefficient information 3.

Figure 4:
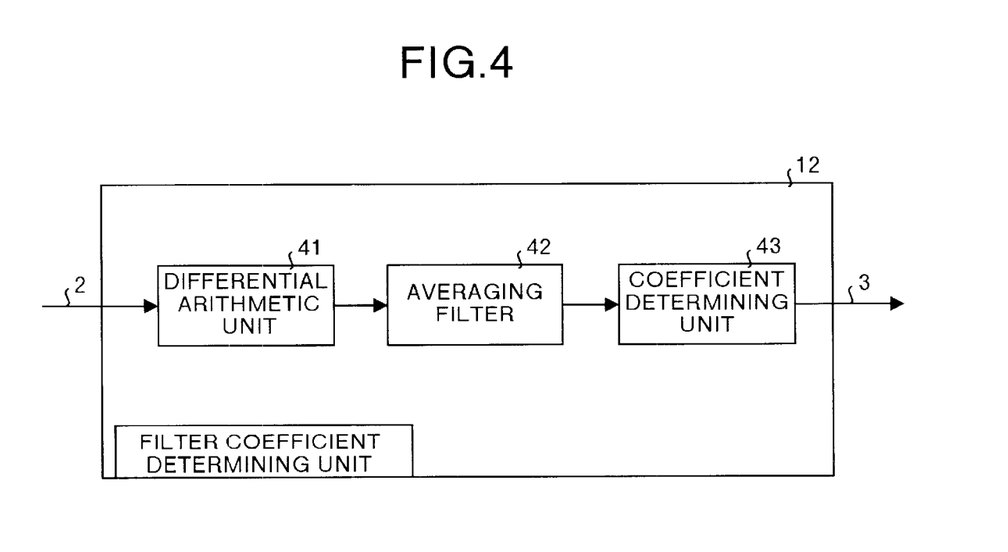
FIG. 4 is a diagram showing an example of an internal structure of a filter coefficient determining unit 12.

FIG. 4 is a diagram showing an example of an internal structure of the filter coefficient determining unit 12. In FIG. 4, legend 41 denotes a differential arithmetic unit for calculating a differential of the estimated frequency error value 2, and legend 42 denotes an averaging filter for suppressing a noise component by averaging the output of the differential arithmetic unit 41. Legend 43 denotes a coefficient determining unit for determining the filter coefficient information 3 based on the output of the averaging filter 42.

The operation of the frequency error estimating apparatus will be explained next. First, the received signal 1 is input to the frequency error estimating apparatus 11, that is, the D-symbol differential detection type frequency error estimating unit 11a shown in FIG. 2. The D-symbol differential detection type frequency error estimating unit 11a that has received the received signal 1 operates in a similar manner to that of the D-symbol differential detection type frequency error estimating unit shown in FIG. 8 (corresponding to the equations (1) to (5)) and outputs the estimated frequency error value 2. For obtaining the output (d2(nT)) of the averaging filter 23, the equation (5) is used. The multiplier coefficient α changes based on the filter coefficient information 3.

The operation of the filter coefficient determining unit 12 that calculates the filter coefficient information 3 will be explained next. It is assumed that a frequency error changes in proportion to time based on a time variation in the Doppler frequency. It is also assumed that the estimated frequency error value 2 output by the frequency error estimating unit 11 is an optimum (correct) value. Therefore, the estimated frequency error value 2 is output as an angular frequency error ($\Delta\omega T$) from one symbol, and this is expressed by the following equation (7).

$$\Delta\omega T = AnT + B \quad (7)$$

As explained above, the estimated frequency error value 2 changes in proportion to time (nT). In other words, when the time variation in the Doppler frequency becomes fast, the absolute value of the variable A becomes large accordingly.

The differential amplifier 41 calculates a differential of the estimated frequency error value $\Delta\omega T$ from R symbols. In the present embodiment, the output ($\Delta\omega d$) of the differential amplifier 41 is expressed by the following equation (8).

$$\Delta\omega d = ART \quad (8)$$

The averaging filter 42 averages the output of the differential arithmetic unit 41, and suppresses a noise component. As the averaging filter, the primary IIR filter shown in FIG. 9, or a higher-order IIR filter or an FIR (finite impulse response) filter may be used. Further, as described above, it is assumed that there is no noise component in this case. Therefore, the output of the averaging filter 42 is held, and this can be expressed directly by the equation (8).

The coefficient determining unit 43 determines the filter coefficient information 3 according to the value of the output ($\Delta\omega d$) of the averaging filter 42. For example, the filter coefficient information 3 is the multiplier coefficient α of the multiplier 31, and the multiplier coefficient of the multiplier 34 is set as 1−α.

Specifically, in the coefficient determining unit 43, when a time variation in the Doppler frequency is slow, the absolute value of the variable A becomes small. Therefore, the absolute value of $\Delta\omega d$ also becomes small. When a time variation in the Doppler frequency is fast, the absolute value of the variable A becomes large. Therefore, the absolute value of $\Delta\omega d$ also becomes large. In other words, $\Delta\omega d$ becomes a yard stick that shows a size of the time variation in the Doppler frequency. As explained above, when the absolute value of $\Delta\omega d$ is smaller than a predetermined value, the coefficient determining unit 43 sets α to a value as small as possible. On the other hand, when the absolute value of $\Delta\omega d$ is larger than a predetermined value, the coefficient determining unit 43 sets α to a value as large as possible. With this arrangement, it is possible to increase the averaging effect of the averaging filter 23 when the time variation in the Doppler frequency is slow. As a result, it is possible to estimate a frequency error in high precision. On the other hand, when the time variation in the Doppler frequency is fast, it is possible to estimate a frequency error in high precision by following this variation.

Figure 5:
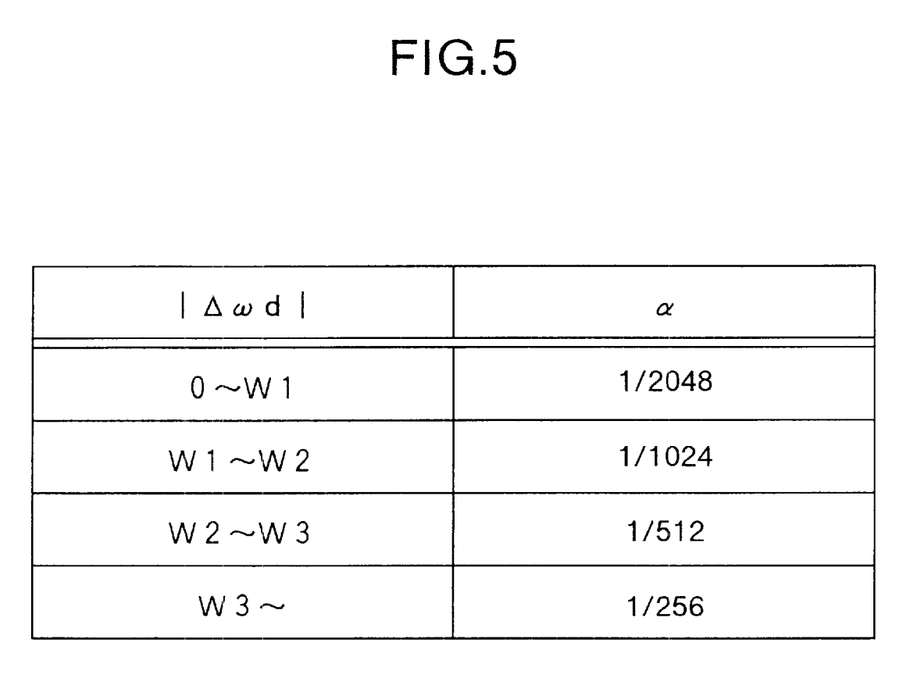
FIG. 5 shows an example of a correspondence table.

In the present embodiment, as an example of a method of determining the multiplier coefficient α, a correspondence table is prepared that shows a relationship between the absolute value of Δωd and the multiplier coefficient α, as shown in FIG. 5. The values of the multiplier coefficients α in the correspondence table are determined in advance to take optimum values by a simulation using a calculator or something like that. The example of the correspondence table shown in FIG. 5 is for changing the multiplier coefficient α at four stages according to the values of Δωd. This relationship is 0<W1<W2<W3. Although the correspondence table employs the four stages in this case, the number of stages is not limited to four. It is also possible to change the multiplier coefficient α at any optional number of stages, for example, two stages or above.

Therefore, the coefficient determining unit 43 can select the multiplier coefficient α according to the value of Δωd by referring to the correspondence table. With this arrangement, it is possible to select optimum α according to the time variation in the Doppler frequency. It is possible to update the multiplier coefficient α for each symbol. However, in consideration of the stability of the filter coefficient determining unit 12, it is preferable to update the multiplier coefficient based on a specific period by using a counter. As this period, it is preferable to use the convergence time of the frequency error estimating unit 11.

As explained above, according to the present embodiment, it is possible to satisfy both the level of following the time variation in the Doppler frequency and the precision in estimating the frequency error, by changing the characteristics of the averaging filter for suppressing a noise component of the phase change information according to the size of the time variation in the Doppler frequency, regardless of the size of the time variation in the Doppler frequency.

Figure 6:
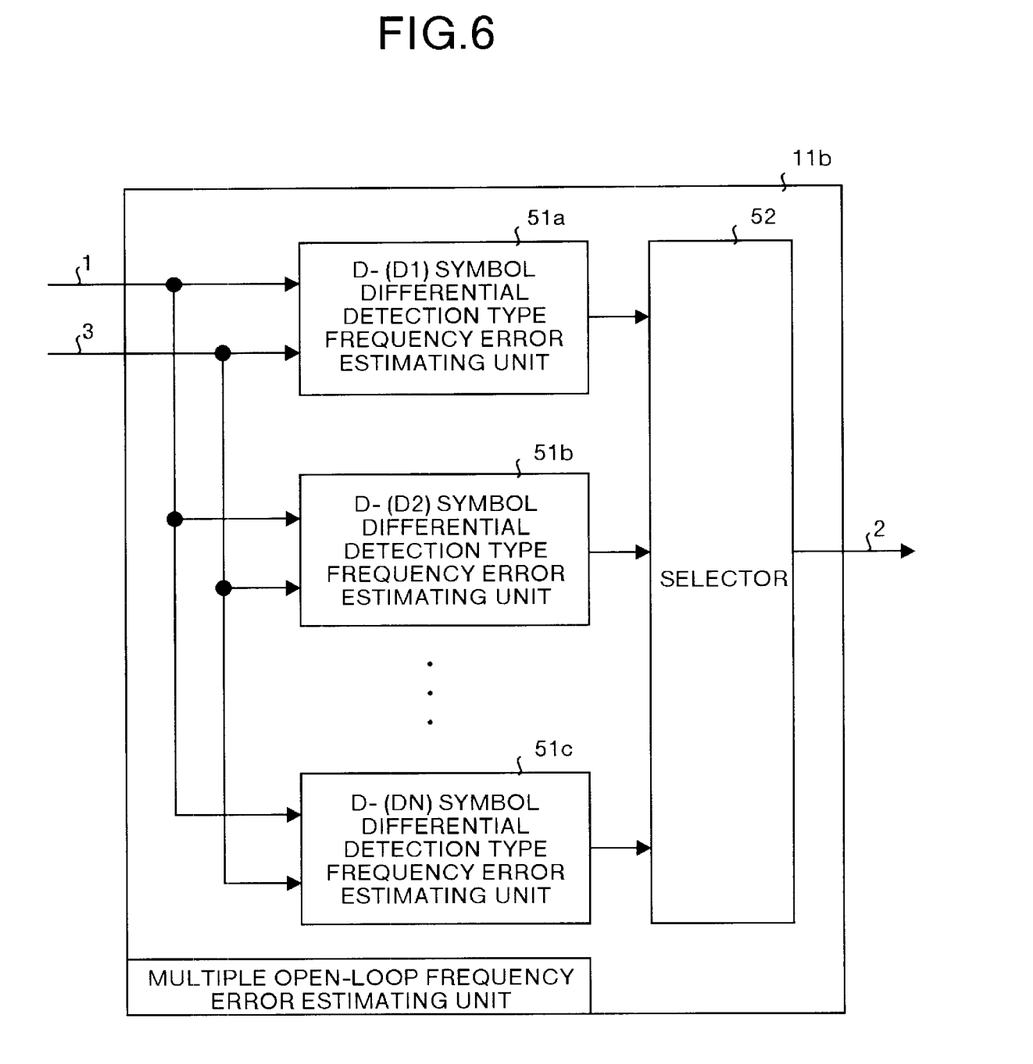
FIG. 6 is a block diagram showing an example of a structure of a frequency error estimating apparatus relating to a second embodiment of the present invention.

A frequency error estimating apparatus relating to a second embodiment of the present invention has a similar structure to that of the frequency error estimating apparatus in the first embodiment shown in FIG. 1, except that the internal structure of the frequency error estimating unit 11 is different. FIG. 6 is a block diagram showing an example of an internal structure of the frequency error estimating apparatus 11 in the present embodiment. This frequency error estimating apparatus 11 is, for example, a multiple open-loop frequency error estimating unit 11b.

In the present embodiment, the multiple open-loop frequency error estimating unit 11b is used as the frequency error estimating apparatus 11. Based on this arrangement, it is possible to achieve higher estimate precision over a wider estimating range than it is possible to achieve in the first embodiment. The multiple open-loop frequency error estimating unit is described in detail in "A Multiple Open-Loop Frequency Estimation Based on Differential Detection for MPSK", IEICE Trans. Commun., Vol. E82-B, 1, pp. 136–144, Jan., 1999.

In FIG. 6, legends 51a, 51b, . . . , and 51c denote N D-symbol differential detection type frequency error estimating units provided in parallel. Each of these D-symbol differential detection type frequency error estimating units has a structure similar to that of the D-symbol differential detection type frequency error estimating unit 11a shown in FIG. 2. The D-symbol differential detection type frequency error estimating units 51a, 51b, . . . , and 51c have mutually different delay wave symbol distances D1 to DN respectively, that correspond to the delay wave symbol distance D in the D-symbol differential detector 22. Legend 52 denotes a selector for selectively outputting an optimum estimated frequency error value (that is considered to be correct) based on estimated frequency error values that are output from the D-symbol differential detection type frequency error estimating units 51a, 51b, . . . , and 51c.

The operation of the frequency error estimating apparatus in the present embodiment having the above-described structure will be explained next. First, the received signal 1 is input to the frequency error estimating apparatus 11, that is, the multiple open-loop frequency error estimating unit 11b shown in FIG. 6. The multiple open-loop frequency error estimating unit 11b that has received the received signal 1 branches the input received signal 1 into N systems. The multiple open-loop frequency error estimating unit 11b then inputs the divided received signals to the D-symbol differential detection type frequency error estimating units 51a, 51b, . . . , and 51c respectively that have mutually different differential detection symbol distances (D1 to DN) provided in parallel.

Each of the D-symbol differential detection type frequency error estimating units carries out a differential detection based on a distance different from the other symbol distance, and estimates a frequency error. The differential detection symbol distances are set in the order of D1<D2<. . . <DN. In the present embodiment, when a differential detection symbol distance is short, the estimate range of a frequency error becomes wide, but the estimate precision becomes low. On the other hand, when a differential detection symbol distance is long, the estimate range of a frequency error becomes narrow, but the estimate precision becomes high. As explained above, according to the multiple open-loop frequency error estimating unit 11b of the present embodiment, a plurality of D-symbol differential detection type frequency error estimating units are laid out in parallel, starting from the D-symbol differential detection type frequency error estimating unit 51a that has a shortest differential detection symbol distance to the D-symbol differential detection type frequency error estimating unit 51c that has a longest differential detection symbol distance. Further, the selector 52 selects an output from the outputs of these D-symbol differential detection type frequency error estimating units. Based on this arrangement, it is possible to achieve high estimate precision over a wide estimate range.

As an example, the operation of the multiple open-loop frequency error estimating unit consisting of three D-symbol differential detection type frequency error estimating units will be explained in detail below. In this multiple open-loop frequency error estimating unit, a differential detection symbol distance Di (where i=1, 2, . . . , and N) is set as shown in the following equation (9).

$$Di = 2^{(i-1)} (i=1, 2, 3) \qquad (9)$$

In the equation (9), ^ expresses power.

Figure 7:
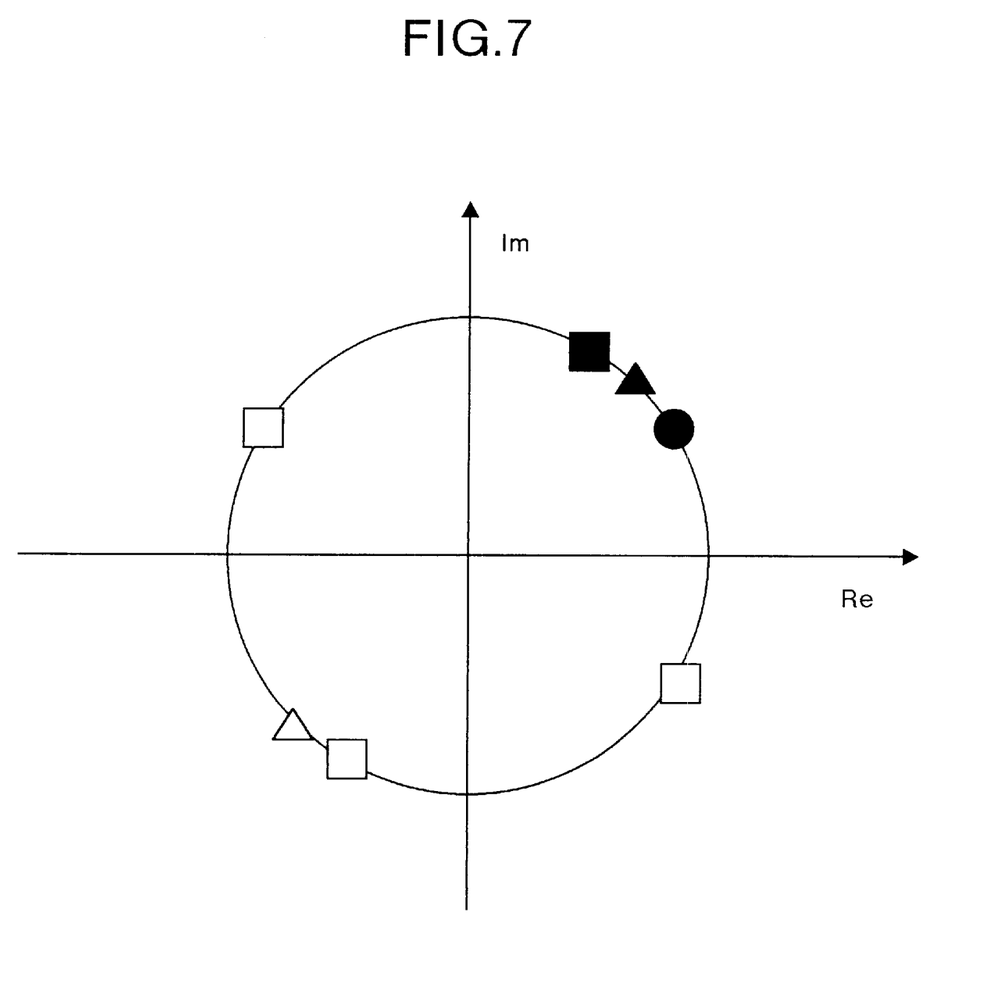
FIG. 7 shows a method of selecting a frequency error estimated by a plurality of D-symbol differential detection type frequency error estimating units.

Therefore, when an actual frequency error is π/4, because of the uncertainty in the frequency, candidates of estimate values for the three D-symbol differential detection type frequency error estimating units become one (o), two (Δ), and four (□) that correspond to the respective differential detection symbol distance as shown in FIG. 7. In this multiple open-loop frequency error estimating unit 11b, the selector 52 first selects Δ (a black triangle in the drawing) that is closest to o from the two candidates (Δ). Next, the selector 52 selects □ (a black square in the drawing) that is closest to Δ that has been selected previously from the four candidates (□). Then, the multiple open-loop frequency error estimating unit 11b outputs the selected □ as the estimate value of the frequency error.

As explained above, the multiple open-loop frequency error estimating unit 11b operates while eliminating the uncertainty in the frequency. Therefore, the D-(D1) symbol differential detection type frequency error estimating unit 51a determines the estimating range of a frequency error, and the D-(DN) symbol differential detection type frequency error estimating unit 51c determines the estimate precision. In other words, based on the multiple open-loop frequency error estimating unit 11b of the present embodiment, it is possible to achieve both the wide estimating range and high estimate precision at the same time.

Further, in the operation of the multiple open-loop frequency error estimating unit 11b, the multiplier coefficient α of the averaging filter 23 in each D-symbol differential detection type frequency error estimating unit, that is, α in the calculation equation of the averaging filter 23 shown in the equation (5), changes based on the filter coefficient information 3. The filter coefficient determining unit 12 determines the filter coefficient information 3 based on the differential between the estimated frequency error values, in a similar manner to that of the first embodiment. With this arrangement, it is possible to increase the averaging effect by setting α to a small value when the time variation in the Doppler frequency is slow. As a result, it is possible to estimate a frequency error in high precision. On the other hand, when the time variation in the Doppler frequency is fast, it is possible to estimate a frequency error in high precision by setting α to a large value and by following this variation. In the present embodiment, it is also possible to use a correspondence table as shown in FIG. 5 like in the first embodiment.

As explained above, according to the present embodiment, like in the above-explained first embodiment, it is possible to satisfy both the level of following the time variation in the Doppler frequency and the precision in estimating the frequency error, by changing the characteristics of the averaging filter for suppressing a noise component of the phase change information according to the size of the time variation in the Doppler frequency, regardless of the size of the time variation in the Doppler frequency. Further, by using the multiple open-loop frequency error estimating unit 11b that has a plurality of the D-symbol differential detection type frequency error estimating units laid out in parallel, it is possible to achieve both higher estimate precision and a wider estimating range at the same time.

While the present invention has been explained with reference to the first and second embodiments, it is possible to modify the invention in various ways within the scope of the gist of this invention. They are all included within the range of the present invention.

As explained above, according to the present invention, there is an effect that it is possible to obtain a frequency error estimating apparatus capable of satisfying both the level of following the time variation in the Doppler frequency and the precision in estimating the frequency error, by changing the characteristics of a filter for suppressing a noise component of a received signal according to the size of the time variation in the Doppler frequency.

Further, according to the present invention, when the time variation in the Doppler frequency is slow, the filter coefficient is set to a value as small as possible, and when the time variation in the Doppler frequency is fast, the filter coefficient is set to a value as large as possible. The frequency error estimating unit estimates a frequency error based on this filter coefficient. With this arrangement, there is an effect that when the time variation in the Doppler frequency is slow, the filter averaging effect is increased, and it is possible to estimate the frequency error in high precision. On the other hand, there is an effect that when the time variation in the Doppler frequency is fast, it is possible to estimate the frequency error in high precision by following this variation.

Further, according to the present invention, the frequency error estimating apparatus operates while eliminating the uncertainty in the frequency by selecting an optimum frequency error. Therefore, the differential detection type frequency error estimating unit with a shortest distance of a differential detection symbol determines an estimating range of a frequency error. Then, the differential detection type frequency error estimating unit with a longest distance of a differential detection symbol determines the estimate precision. With this arrangement, there is an effect that it is possible to achieve both the wide estimating range and high estimate precision at the same time.

Further, according to the present invention, there is prepared in advance a correspondence table that relates differential values between estimate values of the frequency error to the filter coefficients. The values of the multiplier coefficients in the correspondence table are determined in advance to take optimum values by a simulation using a calculator or something like that. With this arrangement, it is possible to select easily a filter coefficient corresponding to a differential value by referring to the correspondence table. As a result, there is an effect that it is possible to select an optimum filter coefficient according to a time variation in the Doppler frequency.

Further, according to the present invention, while it is possible to update the filter coefficient for each symbol, the updating is carried out in a specific period by using a counter in this case. With this arrangement, there is an effect that it is possible to improve easily the stability of the filter coefficient determining unit.

Further, according to the present invention, there is an effect that it is possible to obtain a frequency error estimating method that satisfies both the level of following the time variation in the Doppler frequency and the precision in estimating the frequency error, by changing the characteristics of a filter for suppressing a noise component of a received signal according to the size of the time variation in the Doppler frequency.

Further, according to the present invention, when the time variation in the Doppler frequency is slow, the filter coefficient is set to a value as small as possible, and when the time variation in the Doppler frequency is fast, the filter coefficient is set to a value as large as possible. At the first step, a frequency error is estimated based on this filter coefficient. With this arrangement, there is an effect that when the time variation in the Doppler frequency is slow, the filter averaging effect is increased, and it is possible to estimate the frequency error in high precision. On the other hand, there is an effect that when the time variation in the Doppler frequency is fast, it is possible to estimate the frequency error in high precision by following this variation.

Further, according to the present invention, the operation is carried out while eliminating the uncertainty in the frequency by selecting an optimum frequency error. Therefore, an estimating range of a frequency error is determined at the seventh step when a distance of a differential detection symbol is shortest. Then, the estimate precision is determined at the seventh step when a distance of a differential detection symbol is longest. With this arrangement, there is an effect that it is possible to achieve both the wide estimating range and high estimate precision at the same time.

Further, according to the present invention, there is prepared in advance a correspondence table that relates differential values between estimate values of the frequency error to the filter coefficients. The values of the multiplier coefficients in the correspondence table are determined in advance to take optimum values by a simulation using a calculator or something like that. With this arrangement, it is possible to select easily a filter coefficient corresponding to a differential value by referring to the correspondence table. As a result, there is an effect that it is possible to select an optimum filter coefficient according to a time variation in the Doppler frequency.

Further, according to the present invention, while it is possible to update the filter coefficient for each symbol, the updating is carried out in a specific period by using a counter in this case. With this arrangement, there is an effect that it is possible to improve easily the stability of the filter coefficient obtained at the second step.

INDUSTRIAL APPLICABILITY

The frequency error estimating apparatus and the frequency error estimating method relating to the present invention are useful for estimating a frequency error or a frequency differential between a local oscillation frequency and a carrier frequency of a received signal in a receiver used for a satellite communication, a mobile satellite communication and a mobile communication. The frequency error estimating apparatus and the frequency error estimating method relating to the present invention are suitable for securing high precision in estimating a frequency error without losing the level of following the time variation in the Doppler frequency.

What is claimed is:

1. A frequency error estimating apparatus for estimating a frequency error between a local oscillation frequency and a carrier frequency of a received signal in a receiver, the frequency error estimating apparatus comprising:
   a frequency error estimating unit for estimating a frequency error based on a plurality of phase changes in the received signal, and for suppressing a noise component over the phase changes with a filter; and
   a filter characteristic determining unit for changing the characteristics of the filter based on the frequency error estimated by the frequency estimating unit, thereby changing an averaging effect of the filter to account for time variation of Doppler frequency.

2. The frequency error estimating apparatus according to claim 1, wherein the frequency error estimating unit includes,
   a modulation component removing unit that removes a modulation component from the received signal;
   a phase change information generating unit that generates phase change information by performing differential detection over a period of a second symbol based on a signal after removing a variation component,
   an averaging filter unit that suppresses a noise component in the phase change information based on the filter coefficient; and
   a frequency error estimating unit that calculates a frequency error estimate value based on a signal after suppressing the noise component.

3. The frequency error estimating apparatus according to claim 1, the frequency error estimating unit includes,
   a plurality of differential detection type frequency error estimating units that generate phase change information by performing differential detection over periods of predetermined symbols based on a received signal after removing a modulation component, then suppress a noise component in the phase change information based on the filter coefficient, and thereafter estimate a frequency error based on a signal after suppressing the noise component; and
   a selecting unit that selects an optimum frequency error, based on a predetermined standard, from a plurality of frequency errors that have been estimated by the plurality of differential detection type frequency error estimating units after performing differential detection over different periods of symbols based on received signals.

4. The frequency error estimating apparatus according to claim 1, wherein the filter coefficient determining unit includes in advance a correspondence table that relates differential values between estimate values of the frequency error to the filter coefficients, whereby, after calculating a differential value, the filter coefficient determining unit, selects a filter coefficient corresponding to the differential value from the correspondence table, and changes the characteristics of the filter according to the value of the selected filter coefficient.

5. The frequency error estimating apparatus according to claim 4, wherein the filter coefficient determining unit further includes a counter of a specific period, whereby the filter coefficient determining unit updates the filter coefficient in a period determined by the counter.

6. A frequency error estimating method for estimating a frequency error between a local oscillation frequency and a carrier frequency of a received signal in a receiver, the frequency error estimating method comprising:
   estimating a frequency error based on a plurality of phase changes in the received signal and for suppressing a noise component over the phase changes with a filter; and
   changing the characteristics of the filter based on the estimated frequency error, thereby changing an averaging effect of the filter to account for time variation of Doppler frequency.

7. The frequency error estimating method according to claim 6, wherein the first step includes,
   a third step of removing a modulation component from the received signal;
   a fourth step of generating phase change information by performing differential detection over a period of a second symbol based on a signal after removing a variation component,
   a fifth step of suppressing a noise component in the phase change information based on the filter coefficient; and
   a sixth step of calculating a frequency error estimate value based on a signal after suppressing the noise component.

8. The frequency error estimating method according to claim 6, wherein the first step includes,
   a plurality of seventh steps of generating phase change information by performing differential detection over periods of predetermined symbols based on a received signal after removing a modulation component, then suppressing a noise component in the phase change information based on the filter coefficient, and thereafter estimating a frequency error based on a signal after suppressing the noise component; and an eighth step of selecting an optimum frequency error, based on a predetermined standard, from a plurality of frequency errors that have been estimated by the plurality of seventh steps after performing differential detection over different periods of symbols based on received signals.

9. The frequency error estimating method according to claim 6, wherein the second step includes a ninth step of preparing in advance a correspondence table that relates differential values between estimate values of the frequency error to the filter coefficients, whereby, after calculating a differential value, a filter coefficient corresponding to the differential value is selected from the correspondence table, and the characteristics of the filter are changed according to the value of the selected filter coefficient.

10. The frequency error estimating method according to claim 9, wherein the second step includes a tenth step of counting in a specific period, whereby the filter coefficient is updated in a period determined by the counter.

11. The frequency error estimating apparatus according to claim 1, wherein the filter in the frequency error estimating unit is capable of changing the characteristics with a filter coefficient, and the filter characteristic determining unit calculates the filter coefficient based on a change of the frequency error estimated.

12. The frequency error estimating apparatus according to claim 1, wherein the frequency error estimating unit comprises phase change detection means for detecting the phase changes based on the received signal.

13. A frequency error estimating apparatus for estimating a frequency error in received signals on which a Doppler shift affects, the frequency error estimating apparatus comprising:

a frequency error estimating unit for estimating a plurality of phase changes in the received signals, and comprising a filter for suppressing a noise component over the phase changes to estimate the frequency error; and a filter characteristic determination unit for determining and changing a characteristic of the filter in accordance with a variation of Doppler frequency, thereby changing an averaging effect of the filter to account for time variation of Doppler frequency.

14. The frequency error estimating apparatus according to claim 13, wherein the filter is capable of changing the characteristic in accordance with a filter coefficient.

15. The frequency error estimating apparatus according to claim 14, wherein the filter characteristic determination unit changes the filter coefficient in accordance with the variation of Doppler frequency.

16. The frequency error estimating apparatus according to claim 15, wherein the filter is an averaging filter, and the filter characteristic determination unit changes the filter coefficient to increase an average effect of the averaging filter when time variation of Doppler frequency is slow.

17. The frequency error estimating apparatus according to claim 13, wherein the variation of Doppler frequency changes in accordance with the frequency error.

18. A receiver for satellite, satellite mobile, or mobile communication in which a carrier frequency of a received signal receives a Doppler shift, and the carrier frequency is detected for employing a synchronous detection system, the receiver comprising:

a frequency error estimating unit for estimating a frequency error based on a plurality of phase changes in the received signal, and for suppressing a noise component over the phase changes with a filter to estimate the frequency error; and a filter characteristic determining unit for changing the characteristics of the filter based on the frequency error estimated by the frequency estimating unit, thereby changing an averaging effect of the filter to account for time variation of Doppler frequency.

* * * * *